United States Patent

Blanchet-Fincher

[11] Patent Number: 5,840,463
[45] Date of Patent: Nov. 24, 1998

[54] PHOTOSENSITIVE DONOR ELEMENT ASSEMBLAGES AND ASSOCIATED PROCESS FOR LASER-INDUCED THERMAL TRANSFER

[75] Inventor: Graciela Beatriz Blanchet-Fincher, Greenville, Del.

[73] Assignee: E. I. du Pont de Nemours and Company, Wilmington, Del.

[21] Appl. No.: 891,776

[22] Filed: Jul. 14, 1997

[51] Int. Cl.[6] .............................. G03C 5/00; G03C 8/02
[52] U.S. Cl. ................. 430/201; 430/200; 430/213.1; 430/945; 430/964
[58] Field of Search ................................. 430/200, 201, 430/273.1, 945, 964

[56] References Cited

U.S. PATENT DOCUMENTS

| | | | |
|---|---|---|---|
| 4,105,569 | 8/1978 | Crossfield | 252/8.6 |
| 4,347,300 | 8/1982 | Shimazu et al. | 430/156 |
| 4,476,267 | 10/1984 | Barda et al. | 524/265 |
| 4,588,674 | 5/1986 | Stewart et al. | 430/273 |
| 4,963,606 | 10/1990 | Schleifstein | 524/180 |
| 4,985,503 | 1/1991 | Bronstert et al. | 525/193 |
| 4,990,580 | 2/1991 | Ishihara et al. | 526/160 |
| 5,156,938 | 10/1992 | Foley et al. | 430/200 |
| 5,162,445 | 11/1992 | Powers et al. | 525/333.4 |
| 5,171,650 | 12/1992 | Ellis et al. | 430/20 |
| 5,212,232 | 5/1993 | Kuramoto et al. | 524/779 |
| 5,238,990 | 8/1993 | Yu et al. | 524/504 |
| 5,256,506 | 10/1993 | Ellis et al. | 430/20 |
| 5,262,275 | 11/1993 | Fan | 430/273 |
| 5,308,737 | 5/1994 | Bills et al. | 430/945 |
| 5,378,385 | 1/1995 | Thomas et al. | 252/68 |
| 5,506,086 | 4/1996 | Van Zoeren | 430/201 |
| 5,523,192 | 6/1996 | Blanchet-Fincher | 430/200 |
| 5,607,814 | 3/1997 | Fan et al. | 430/258 |

FOREIGN PATENT DOCUMENTS

| | | |
|---|---|---|
| 0 113 167 A3 | 7/1984 | European Pat. Off. . |
| 649757 | 4/1995 | European Pat. Off. . |
| 0 689 939 A1 | 1/1996 | European Pat. Off. . |
| 0 689 940 A1 | 1/1996 | European Pat. Off. . |
| 58-212993 | 12/1983 | Japan . |
| 60-34898 | 2/1985 | Japan . |
| 60-46296 | 3/1985 | Japan . |
| 60-110497 | 6/1985 | Japan . |
| 60-110498 | 6/1985 | Japan . |
| 61-206691 | 9/1986 | Japan . |
| 61-254354 | 11/1986 | Japan . |
| 61-291184 | 12/1986 | Japan . |
| 62-82083 | 4/1987 | Japan . |
| 62-176899 | 8/1987 | Japan . |
| 62-231790 | 10/1987 | Japan . |
| 62-279987 | 12/1987 | Japan . |
| 63-276591 | 11/1988 | Japan . |
| 2-175291 | 12/1988 | Japan . |
| 63-319191 | 12/1988 | Japan . |
| 63-319192 | 12/1988 | Japan . |
| 1-118842 | 11/1989 | Japan . |
| WO 90/12342 | 10/1990 | WIPO . |

*Primary Examiner*—Christopher G. Young

[57] ABSTRACT

Photosensitive donor elements, assemblages, and associated processes are described for use in a laser-induced thermal transfer process, said elements comprising in the order listed a support; a photohardenable layer comprising a binder, at least one photohardenable component, and an initiator; optionally a barrier layer; optionally a coversheet; at least one ejection layer comprising a first polymer having a decomposition temperature $T_1$; at least one top layer having an outer surface and comprising (i) a second polymer having a decomposition temperature $T_2$ and (ii) an imageable component. For photomask fabrication applications, the imageable component is preferably black. Assemblages made with these donor elements are useful for fabrication of photomasks on various photohardenable materials, including flexographic printing plates and photoresists. These photomasks most preferably are useful in creating a relief image with a photosensitive element, such as flexographic printing plate or a photoresist.

5 Claims, 1 Drawing Sheet

5,840,463

PHOTOSENSITIVE DONOR ELEMENT ASSEMBLAGES AND ASSOCIATED PROCESS FOR LASER-INDUCED THERMAL TRANSFER

FIELD OF THE INVENTION

This invention relates to a photosensitive donor element for laser-induced thermal transfer processes. More particularly, it relates to a photosensitive multilayer donor element.

BACKGROUND OF THE INVENTION

Laser-induced thermal transfer processes are well-known in applications such as color proofing and lithography. Such laser-induced processes include, for example, dye sublimation, dye transfer, melt transfer, and ablative material transfer. These processes have been described in, for example, Baldock, U. K. U.S. Pat. No. 2,083,726; DeBoer, U.S. Pat. No. 4,942,141; Kellogg, U.S. Pat. No. 5,019,549; Evans, U.S. Pat. No. 4,948,776; Foley et al., U.S. Pat. No. 5,156,938; Ellis et al., U.S. Pat. No. 5,171,650; and Koshizuka et al., U.S. Pat. No. 4,643,917.

Laser-induced processes use a laserable assemblage comprising (a) a donor element that contains the imageable component, i.e., the material to be transferred, and (b) a receiver element. The donor element is imagewise exposed by a laser, usually an infrared laser, resulting in transfer of material to the receiver element. The exposure takes place only in a small, selected region of the donor at one time, so that the transfer can be built up one pixel at a time. Computer control produces transfer with high resolution and at high speed.

For the preparation of images for proofing applications and in photomask fabrication on a photopolymer (e.g., a photoresist or a flexographic printing plate), the imageable component is a colorant. For the preparation of lithographic printing plates, the imageable component is an olephilic material which will receive and transfer ink in printing.

Laser-induced processes are fast and result in transfer of material with high resolution. However, in many cases, the resulting transferred material does not have the required durability of the transferred image. In dye sublimation processes, light-fastness is frequently lacking. In ablative and melt transfer processes, poor adhesion and/or durability can be a problem. U.S. Pat. No. 5,563,019 and U.S. Pat. No. 5,523,192 improved multilayer thermal imaging elements and associated processes are disclosed that do afford improved adhesion and/or durability of the transferred images. However, there is a continuing need for still further improved thermal imaging elements and associated processes having improved image transfer efficiency and higher sensitivity of the elements.

Photosensitive elements which can be used to make relief images are well known. The photosensitive compositions generally comprise a photoinitiator and a component which is capable of reacting with the initiator, after it has been activated by exposure to actinic radiation. The reaction of the initiator and the second component produces a change in the physical properties of the layer such that the exposed areas can be differentiated from the nonexposed areas.

Imagewise exposure of a photosensitive element as currently known to the art generally requires the use of a phototool which is a mask (photomask) having clear and opaque areas covering the photosensitive layer (e.g., photoimageable and/or photopolymerizable layer). The phototool prevents exposure and photoreaction in the non-image areas, so that the image can be later developed. The phototool is clear, i.e., transparent to actinic radiation, in the image areas so that those areas are exposed to radiation and has high optical density in the areas where exposure is not desired. The phototool is usually a photographic negative (or positive) of the desired printing image. If corrections are needed in the final image a new negative (or positive) must be made. This is a time-consuming process. In addition, the phototool may change slightly in dimension due to changes in temperature and humidity. Thus, the same phototool, when used at different times or in different environments, may give different results and could cause registration problems.

Thus, it would be desirable to eliminate the practice of multiple use of a phototool and having to accurately align a phototool prior to imagewise exposure to avoid registration problems by digitally recording a phototool on a photosensitive element.

SUMMARY OF THE INVENTION

In one embodiment, the invention is an assemblage for use in a laser-induced thermal transfer process, the assemblage comprising:

(A) a photosensitive donor element comprising in order:
  (A1) a support;
  (A2) a photohardenable layer comprising a binder, at least one photohardenable component, and an initiator;
  (A3) optionally a barrier layer;
  (A4) optionally a coversheet;
  (A5) at least one ejection layer comprising a first polymer having a decomposition temperature $T_1$; and
  (A6) at least one top layer having an outer surface and comprising (i) a second polymer having a decomposition temperature $T_2$ and (ii) an imageable component;

and (B) a receiver element comprising in order:
  (B1) a receiver support; and
  (B2) optionally an image-receiving layer; wherein the outer surface of the top layer (A6) is adjacent to and in contact with the receiver support (B1) or the image-receiving layer (B2) of the receiver element and wherein a photomask for use in preparing a relief image is fabricated on the photosensitive donor element according to the laser-induced thermal transfer process.

In another embodiment, the invention is a laser-induced, thermal transfer process which comprises:

(1) imagewise exposing to laser radiation a laserable assemblage comprising:
  (A) a photosensitive donor element comprising in order:
    (A1) a support;
    (A2) a photohardenable layer comprising a binder, at least one photohardenable component, and an initiator;
    (A3) optionally a barrier layer;
    (A4) optionally a coversheet;
    (A5) at least one flexible ejection layer comprising a first polymer having a decomposition temperature $T_1$; and
  (A6) at least one top layer having an outer surface and comprising (i) a second polymer having a decomposition temperature $T_2$ and (ii) an imageable component;

and (B) a receiver element comprising in order:
   (B1) a receiver support; and
   (B2) optionally an image-receiving layer; wherein the outer surface of the top layer (A6) is adjacent to and in contact with the receiver support (B1) or the image-receiving layer (B2) of the receiver element; and
(2) separating the donor element from the receiver element, thereby forming a photomask on the photosensitive donor element.

DETAILED DESCRIPTION OF THE INVENTION

A. Photosensitive Donor Element

Figure 1:
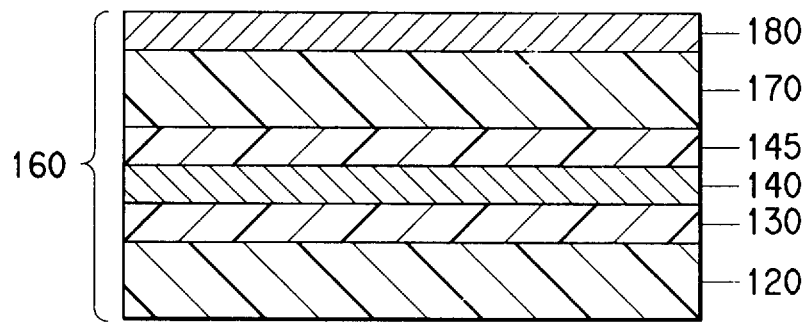
FIG. 1 illustrates a photosensitive donor element (160) of the invention having a support (120), a photohardenable layer (130), a barrier layer (140) (which is optional), a coversheet (145) (which is optional), an ejection layer (170), and a top layer (180).
Figure 2:
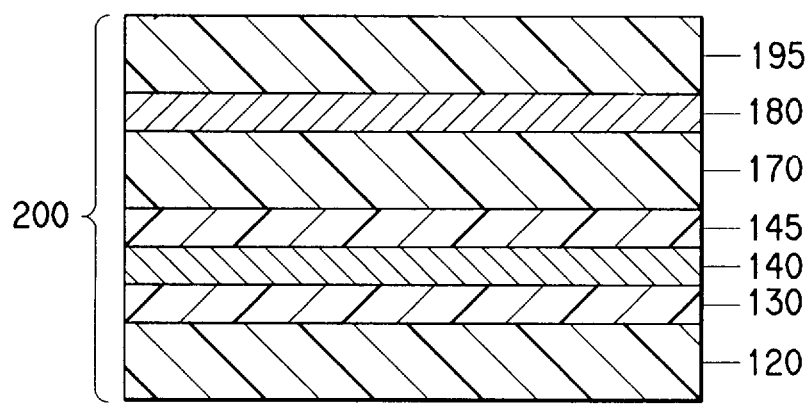
FIG. 2 illustrates a laserable assemblage (200) that is made by bringing donor element (160) in contact with a receiver element (195), such as a sheet of paper, wherein top layer (180) is in contact with the receiver element (195).

The photosensitive donor element of this invention comprises in order:

(A1) a support;
(A2) a photohardenable layer comprising a binder, at least one photohardenable component, and an initiator;
(A3) optionally a barrier layer;
(A4) optionally a coversheet;
(A5) at least one ejection layer comprising a first polymer having a decomposition temperature $T_1$; and
(A6) at least one top layer having an outer surface and comprising
   (i) a second polymer having a decomposition temperature $T_2$, and
   (ii) an imageable component.

In one preferred embodiment, the imageable component is black. This photosensitive donor element is useful in fabricating (forming) a photomask on the donor element, which can subsequently be used to form a relief image.

Most preferably, the photosensitive donor element of this invention is useful in fabricating a photomask on a flexographic printing element, which photomask can be subsequently used to create a relief image.

1. Support

The support can be any material which is conventionally used with photosensitive elements and, in particular, those used to prepare flexographic printing plates or photoresists. Examples of suitable support materials include polymeric films such as those formed by addition polymers and linear condensation polymers, translucent foams and fabrics. A preferred support is polyester film; particularly preferred is polyethylene terephthalate. The support typically has a thickness from 2 to 10 mils (0.0051 to 0.025 cm), with a preferred thickness of 3 to 8 mils (0.0076 to 0.020 cm). In addition, the support can be subbed or surface treated to improve adhesion.

2. Photohardenable Layer

The photohardenable layer generally comprises a photoinitiator, which is sensitive to actinic radiation, and a component that is capable of reacting with the initiator, after it has been activated by exposure to actinic radiation. The interaction of the initiator and the component produces a change in the physical properties of the layer. The areas of the photohardenable layer which have been exposed to actinic radiation are differentiated from the areas which have not been exposed based on the photoinduced difference in the physical properties of the exposed and nonexposed areas. The types of physical property changes in photohardenable layers that can be used to advantage in the process of the invention include changes in solubility, swellability or dispersability, changes in softening point, changes in tackiness, changes in permeability for processing solution, and the like.

Of interest, particularly for the formation of relief images, are those systems in which exposure to actinic radiation effects a change in solubility in the photohardenable layer. As used herein, the term "solubility" is intended to mean the ability to be removed by the action of a developer liquid and is intended to encompass swellability and dispersability, as well as complete solubility. The change in solubility can be an increase due to a photosolubilization reaction, or a decrease due to a photohardening reaction, either photocrosslinking or photopolymerization. Photosolubilization generally occurs by the reaction of a preformed polymer with either pendant reactive groups or other molecules to increase the solubility (or the rate of solubilization) of the photosensitive material. Photocrosslinking generally occurs by the crosslinking of a preformed polymer to form a less soluble crosslinked polymeric network. This can take place either through dimerization of pendant reactive groups attached directly to the polymer chain, or reaction of the polymer with a separate polyfunctional photoactive crosslinking agent. Photopolymerization generally occurs when relatively low molecular weight monomers or oligomers undergo photoinitiated cationic or free radical polymerization to form less soluble polymers.

Photohardenable materials are used as the photohardenable layer in the process of the invention. Photohardenable materials can be photocrosslinkable, photopolymerizable, or combinations of both. Photohardenable materials generally comprise a binder, a photoinitiator or photoinitiator system (hereinafter referred to as "photoinitiator system") and a photohardenable component, which is at least one of (i) a low molecular weight monomer or oligomer capable of undergoing polymerization, (ii) reactive groups pendant to the binder which are capable of reacting with each other or (iii) reactive groups pendant to the binder and a crosslinking agent capable of reacting with the reactive groups.

Materials which can be used as the binder include polymers and copolymers of acrylates, methacrylates, acrylamnides, styrene, vinyl acetate and its partially hydrogenated derivatives, including amphoteric interpolymers. Also gelatin and cellulose esters and ethers, and elastomeric materials, such as polymers and copolymers of butadiene and isoprene can be used. The photoinitiator system is one which, upon irradiation with actinic radiation, forms a species which will initiate either free radical or cationic crosslinking or polymerization reactions. By actinic radiation, it is meant high energy radiation including but not limited to UV, visible, electron beam, and X-ray.

Most photoinitiator systems for free radical reactions in current use are based upon one of two mechanisms: photofragmentation and photoinduced hydrogen abstraction. Suitable photoinitiator systems of the first type include peroxides, such as benzoyl peroxide; azo compounds, such as 2,2'-azobis(butyronitrile); benzoin derivatives, such as benzoin and benzoin methyl ether; derivatives of acetophenone, such as 2,2-dimethoxy-2-phenylacetophenone; ketoxime esters of benzoin; triazines; and biimidazoles. Suitable photoinitiator systems of the second type include anthraquinone and a hydrogen donor; benzophenone and tertiary amines; Michler's ketone alone and with benzophenone; thioxanthones; and 3-ketocoumarins.

Photoinitiator systems suitable for cationic crosslinking or polymerization reactions are those which, upon irradiation, produce a Lewis acid or a protonic Bronsted acid which is capable of initiating polymerization of ethylene oxide or epoxy derivatives. Most photoinitiator systems of this type are onium salts, such as diazonium, iodonium and sulfonium salts.

Sensitizing agents can also be included with the photo-initiator systems discussed above. In general, sensitizing agents are those materials which absorb radiation at a wavelength different than that of the reaction-initiating component, and are capable of transferring the absorbed energy to that component. Thus, the wavelength of the activating radiation can be adjusted.

As mentioned above, the binder can have pendant groups which are capable of undergoing free-radical induced or cationic crosslinking reactions. Pendant groups which are capable of undergoing free-radical induced crosslinking reactions are generally those which contain sites of ethylenic unsaturation, such as mono-and polyunsaturated alkyl groups; acrylic and methacrylic acids and esters. In some cases, the pendant crosslinking group can itself be photosensitive, as is the case with pendant cinnamoyl or N-alkyl stilbazolium groups. Pendant groups which are capable of undergoing cationic crosslinking reactions include substituted and unsubstituted epoxide and aziridine groups.

Monomers undergoing free-radical polymerization are typically ethylenically unsaturated compounds. Examples of which include acrylate and methacrylate esters of alcohols and their low molecular weight oligomers. Examples of suitable monomers and oligomers with two or more sites of unsaturation capable of undergoing free radical induced addition reactions, include the polyacrylate and polymethacrylate esters of polyols such as triethyleneglycol, trimethylolpropane, 1,6-hexanediol, and pentaerythritol, and their low molecular weight monomers. Esters of ethoxylated trimethyolol propane, in which each hydroxyl group has been reacted with several molecules of ethylene oxide, as well as monomers derived from bisphenol A diglycidyl ether and monomers derived from urethanes have also been used. Monomers which undergo cationic polymerization include mono-and polyfunctional epoxides and aziridines. In some cases, where there are residual reactive sites in the binder, e.g., residual unsaturation or epoxide groups, the crosslinking agent can also react with the binder.

Although, any of the above described photosensitive materials can be used in the process of the invention, photohardenable materials which are suitable for the preparation of flexographic printing plates and/or photoresists are preferred, and normally used, and are described in greater detail below.

For creating a relief image on a flexographic printing plate or with a photoresist according to this invention, the photohardenable material comprises a binder, at least one photohardenable component (e.g., a monomer) and an initiator system, where the initiator system has a sensitivity to actinic radiation. In most cases, the initiator will be sensitive to visible or ultraviolet radiation. Any photohardenable compositions which are suitable for the formation of flexographic printing plates or imaged resist patterns can be used for the present invention. Examples of suitable compositions for flexographic printing plates have been disclosed, for example, in Chen et al. U.S. Pat. No. 4,323,637, Gruetzmacher et al. U.S. Pat. No. 4,427,759 and Feinberg et al. U.S. Pat. No. 4,894,315.

For creating a relief image on a flexographic printing plate, an elastomeric binder is selected. The elastomeric binder can be a single polymer or mixture of polymers which can be soluble or dispersible in aqueous, semi-aqueous or organic solvent developers. Binders which are soluble or dispersible in aqueous or semi-aqueous developers have been disclosed in Alles U.S. Pat. No. 3,458,311; Pohl U.S. Pat. No. 4,442,302; Pine U.S. Pat. No. 4,361,640; Inoue et al., U.S. Pat. No. 3,794,494; Proskow U.S. Pat. No. 4,177,074; Proskow U.S. Pat. No. 4,431,723; and Woms U.S. Pat. No. 4,517,279. Binders which are soluble or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene and isoprene/styrene thermoplastic-elastomeric block copolymers and other copolymers. The block copolymers discussed in Chen U.S. Pat. No. 4,323,636; Heinz et al., U.S. Pat. No. 4,430,417; and Toda et al., U.S. Pat. No. 4,045,231 can be used. It is preferred that the binder be present in at least an amount of 50% by weight of the photohardenable layer.

The term binder, as used herein, encompasses core shell microgels and blends of microgels and preformed macromolecular polymers, such as those disclosed in Fryd et al. U.S. Pat. No. 4,956,252.

For photoresist applications of this invention, the binder component of the photosensitive and/or photohardenable layer of the photosensitive element is preferably a carboxylic acid containing copolymer, such as those disclosed in U.S. Pat. Nos. 3,458,311 and 4,273,857, and can be prepared by any of the addition polymerization techniques known to those skilled in the art such as described therein. The level of carboxylic acid groups is determined for a given composition by optimizing the amount needed for good development in aqueous alkaline developer. Preferred binders are those comprised of comonomers of structural unit:

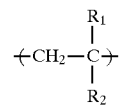

in which $R_1$ is H or alkyl; $R_2$ is phenyl or $CO_2R_3$; and $R_3$ is H or alkyl, which is unsubstituted or substituted. Alkyl groups can contain one to twelve carbon atoms and preferably one to four. Comonomers, which are suitable for forming the binder copolymer, are styrene and unsaturated carboxylic acids and their derivatives, such as (meth)acrylic acid and (meth)acrylates. Acrylic acid, methacrylic acid, methyl methacrylate, styrene, ethyl acrylate, ethyl methacrylate, butyl methacrylate and butyl acrylate are preferred.

The binder copolymers of the invention can be formed by direct copolymerization of one or more ethylenically unsaturated dicarboxylic acid anhydrides, or the corresponding alkyl diesters, with one or more of the above comonomers. Suitable ethylenically unsaturated dicarboxylic acid anhydrides are, for example, maleic anhydride, itaconic acid anhydride and citraconic acid anhydride and alkyl diesters such as the diisobutyl ester of maleic anhydride. The copolymer binder containing acid anhydride functionality can be reacted with primary aliphatic or aromatic amines.

When the photosensitive element is used in a laserable assemblage and subsequently processed to create a resist relief image, development of the composition requires that the binder material should contain sufficient carboxylic acid groups to render the photoresist coating composition processable in aqueous alkaline developer. The coating layer formed from the element will be removed in portions which are not exposed to radiation but will be substantially unaffected in exposed portions during development by aqueous alkaline liquids such as wholly aqueous solutions containing 1% sodium or potassium carbonate by weight for a time period of up to two minutes at a temperature of 30° C. The acid number of the copolymer binder should be within the range of 5 to 500 and preferably from about 20 to 250.

The quantity of total copolymeric binder in the photohardenable layer is from about 10 to 90 parts by weight of the photohardenable layer composition.

One or more cobinders may be present to optimize manufacturability, development or stripping properties, or performance in printed circuit process steps such as electrolytic copper plating or copper etching.

The photohardenable layer can contain a single monomer or mixture of monomers which should be compatible with the binder to the extent that a clear, non-cloudy photosensitive layer is produced. Monomers that can be used in the photohardenable layer are well known in the art. Examples of such monomers can be found in Chen U.S. Pat. No. 4,323,636; Fryd et al., U.S. Pat. No. 4,753,865; Fryd et al., U.S. Pat. No. 4,726,877; and Feinberg et al., U.S. Pat. No. 4,894,315. It is preferred that the monomer be present in at least an amount of 5% by weight of the photohardenable layer.

The photoinitiator system can be any single compound or group of compounds which is sensitive to actinic radiation, generating free radicals which initiate the polymerization of the monomer or monomers without excessive termination. The photoinitiator is generally sensitive to visible or ultraviolet radiation, preferably ultraviolet radiation. It should be thermally inactive at and below 185° C. Examples of suitable photoinitiators include the substituted and unsubstituted polynuclear quinones. Examples of suitable systems have been disclosed in Gruetzmacher et al., U.S. Pat. No. 4,460,675 and Feinberg et al., U.S. Pat. No. 4,894,315. Photoinitiators are generally present in amounts from 0.001% to 10.0% based on the weight of the photohardenable composition.

The photohardenable layer can contain other additives depending on the final properties desired. Such additives include thermal polymerization inhibitors, sensitizers, plasticizers, colorants, antioxidants, antiozonants, fillers or reinforcing agents.

The photohardenable layer can be prepared in many ways by admixing the binder, monomer, initiator, and other ingredients. It is preferred that the photohardenable mixture be formed into a hot melt and then calendered to the desired thickness. An extruder can be used to perform the functions of melting, mixing, deaerating and filtering the composition. The extruded mixture is then calendered between the support and a temporary, removable coversheet. The temporary coversheet is generally previously coated with a barrier layer. The adhesion between the barrier layer and the temporary coversheet must be low, so that the barrier layer will remain intact on the photohardenable layer when the temporary coversheet is removed, which is normally done just prior to use in making a laserable assemblage. Alternatively, the photohardenable material can be placed between the support and the barrier layer coated temporary coversheet in a mold. The layers of material are then pressed flat by the application of heat and/or pressure.

It is particularly advantageous to make the photosensitive donor element in the form of a continuous printing element. The flat sheet photosensitive element, i.e., the support, photohardenable layer and barrier layer, top layer, and optionally other layers, can be reprocessed by wrapping the element around a cylindrical form, usually a printing sleeve or the printing cylinder itself, and fusing the edges of the photosensitive layer together to form a seamless, continuous element. In a preferred method, the photohardenable layer is wrapped around the cylindrical form and the edges joined. One process for joining the edges has been disclosed in German Patent DE 28 44 426. A receiver element can be made is sleeve form and wrapped around the continuous photosensitive element (donor element), such that the top layer of the donor element is adjacent to the receiver element (receiver support or image-receiving layer). The resulting structure is a laserable assemblage.

Continuous printing elements have applications in the flexographic printing of continuous designs such as in wallpaper, decoration and gift wrapping paper. Furthermore, such continuous printing elements are well-suited for mounting on conventional laser equipment. The sleeve or cylinder on which the printing element is wrapped when the edges are fused, can be mounted directly into the laser apparatus where it functions as the rotating drum during the laser exposure step.

Unless otherwise indicated, the term "flexographic printing plate or element" encompasses plates or elements in any form suitable for flexographic printing, including, but not limited to, flat sheets and seamless continuous forms.

As discussed above, to prepare a flexographic printing plate, the laserable assemblage, consisting of the photosensitive donor element and the receiver element is first imagewise exposed to infrared laser radiation in the thermal imaging step to effect fabrication of a photomask on the photosensitive donor element, which is a precursor to the flexographic printing plate. This results in an actinic radiation opaque mask which adheres to the photohardenable layer (or barrier layer or coversheet) in a pattern. The element is exposed overall to actinic radiation, preferably UV radiation, through the mask and then developed to remove the unexposed areas of the photohardenable layer, i.e., those areas which have not been photohardened. If a barrier layer is present, it is removed in at least the unexposed areas.

Developers which can be used with the photohardenable elements which are used to prepare flexographic printing plates include organic solvent developers, aqueous and semi-aqueous solutions. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers contain water and an alkaline material. Other suitable aqueous developer combinations are described in U.S. Pat. No. 3,796,602.

Development time can vary, but it is preferably in the range of about 2 to 25 minutes. Developer can be applied in any convenient manner, including immersion, spraying and brush or roller application. Brushing aids can be used to remove the unpolymerized portions of the composition. For photohardenable systems, washout is frequently carried out in an automatic processing unit which uses developer and mechanical brushing action to remove the unexposed portions of the plate, leaving a relief constituting the exposed image and the floor.

Following development, the relief printing plates are generally blotted or wiped dry, and then dried in a forced air or infrared oven. Drying times and temperatures may vary, however, typically the flexographic plate is dried for 60 to 120 minutes at 60° C. High temperatures are not recommended because the support can shrink and this can cause registration problems.

Additional process steps can be carried out in the preparation of flexographic printing plates from elastomeric photohardenable elements.

One additional step is to give the element a blanket exposure to actinic radiation through the support. This exposure, generally called a backflash exposure, is used to create a shallow layer of photohardened material, or a floor, on the support side of the photohardenable layer and to sensitize the photohardenable layer. The floor provides improved adhesion between the photohardenable layer and the support and also establishes the depth of the plate relief. This backflash exposure can take place before, after or during the other imaging steps. It is preferred that this step take place immediately prior to the exposure step through the radiation opaque mask. Any conventional sources of actinic radiation can be used for this exposure step. Exposure times for the backflash generally range from a few seconds up to about a minute.

Most flexographic printing plates are uniformly postexposed to ensure that the photohardening process (e.g., photopolymerization or photocrosslinking) is complete and that the plate will remain stable during printing and storage. This post-exposure step utilizes the same radiation source as the main exposure.

Detackification is an optional post-development treatment which can be applied if the surface is still tacky, such tackiness not generally being removed in post-exposure. Tackiness can be eliminated by methods well known in the art, such as treatment with bromine or chlorine solutions. Such treatments have been disclosed in, for example, U.S. Pat. Nos. 4,400,459, 4,400,460 and German Patent 28 23 300. Detackification can also be accomplished by exposure to radiation sources having a wavelength not longer than 300 mn, as disclosed in European Published Patent Application 0 017927 and Gibson U.S. Pat. No. 4,806,506.

3. Barrier Layer

In a laserable assemblage, it is frequently desirable to have at least one barrier layer, interposed between the photohardenable layer and the top layer or ejection layer of the photosensitive donor element. The photohardenable layers can be inherently tacky, especially the photohardenable layers used to make flexographic printing plates. The barrier layer can be helpful in achieving the correct adhesion balance. In addition, the barrier layer prevents the migration of monomer, if present, from the photohardenable layer to the top layer or ejection layer. If the monomer is compatible with the materials used in the top layer and/or is migratory, monomer migration may occur with time and can drastically alter the adhesion balance. If the monomer is substantially incompatible with the top layer or substantially nonmigratory, there may be no migration. But if there is even marginal compatibility, migration may occur. When the element is not imaged and developed immediately after it is put together, it is preferred that a barrier layer be present.

The barrier layer should be transparent to actinic radiation so that when the element is exposed to actinic radiation through the photomask created in or from the top layer or in the donor element, the radiation passes through the barrier layer to the underlying photohardenable layer without significant diminution in intensity.

The barrier layer should also initially (i.e., prior to exposure to actinic radiation) be soluble, swellable, or dispersible in the developer solvent for the photopolymerizable layer or it should be liftable in that solvent. By "liftable" it is meant that the solvent is able to lift off the barrier layer at least partially intact.

Two types of barrier layers can be used. The first type is one which is insensitive to actinic radiation and is soluble, swellable, dispersible or liftable in developer solutions for the photopolymerizable layer both before and after exposure to actinic radiation. This type of barrier layer is completely removed in both exposed and unexposed areas, along with the unexposed areas of the photopolymerizable layer, during processing with the developer.

Examples of materials which are suitable for use as the barrier layer of this first type include those materials which are conventionally used as a release layer in flexographic printing elements, such as polyamnides, polyvinyl alcohol, hydroxyalkyl cellulose, copolymers of ethylene and vinyl acetate, amphoteric interpolymers, and combinations thereof. Polyamide is preferred.

The second type of barrier layer is one which is soluble, swellable or dispersible in the developer solvent prior to exposure to actinic radiation, but is not affected by the developer solvent after exposure to actinic radiation. When this type of barrier layer is used, it is removed by the developer solvent only in those areas which are not exposed to actinic radiation. The barrier layer which has been exposed to actinic radiation remains on the surface of the polymerized areas of the photopolymerizable layer and becomes the actual printing surface of the printing plate.

This type of barrier layer can be photosensitive itself, i.e., contain monomer and initiator, or it can become photosensitive when in contact with the photopolymerizable layer. This second type of barrier layer is usually a layer of an elastomeric composition. The composition can consist simply of a nonphoto-sensitive elastomeric binder layer similar to the binder in the photopolymerizable layer or it can be the binder in combination with a monomer and initiator. A preferred barrier layer is an elastomeric composition comprising an elastomeric polymeric binder, a second polymeric binder and optionally a nonmigatory dye or pigment. The elastomeric polymeric binder in the elastomeric composition is generally the same as or similar to the elastomeric binder present in the photopolymer layer. Suitable compositions for the barrier layer are those disclosed as elastomeric compositions in the multilayer cover element described in Gruetzmacher et al., U.S. Pat. Nos. 4,427,759 and 4,460,675.

It is also possible to use more than one barrier layer. For example, an elastomeric barrier layer can be present next to the photohardenable layer and this, in turn, can be overcoated with a barrier layer which is soluble both before and after exposure to actinic radiation. The exact choice of barrier layer(s) will depend on the nature of the photohardenable layer(s) of the photosensitive element and the top layer and other physical requirements of the laserable assemblage.

4. Coversheet

The coversheet should provide the proper adhesion balance with the photohardenable layer and/or the optional barrier layer. Generally, the coversheet is a dimensionally stable polymeric film. The coversheet is generally a thin transparent film of polyester, polycarbonate, polyamide, fluoropolymers, polystyrene, polyethylene, polypropylene, or other strippable material. A preferred coversheet is polyethylene terephthalate. The coversheet typically has a thickness from 0.1 to 10 mils (0.00025 to 0.025 cm), with a preferred thickness of 0.5 to 5 mils (0.0013 to 0.013 cm). The coversheet is another optional layer of the photosensitive donor element. In a preferred embodiment, the coversheet is removed during preparation of the photosensitive donor element and is not present in this element.

5. Ejection Layer

The ejection layer provides the force to effect transfer of the imageable component to the receiver element. When heated, this layer decomposes into gaseous molecules providing the necessary pressure to propel or eject the imageable component onto the receiver element. This is accomplished by using a polymer having a relatively low decomposition temperature (less than about 350° C., preferably less than about 325° C., and more preferably less than about 275° C.). In the case of polymers having more than one decomposition temperature, the first decomposition temperature should be lower than 350° C. Furthermore, in order for the ejection layer to have suitably high flexibility and conformability, it should preferably have a tensile modulus that is less than or equal to 2.5 Gigapascals (GPa), more preferably less than 1.5 GPa, and still more preferably less than 1 Gigapascal (GPa). The polymer chosen should also be one that is dimensionally stable. If the laserable assemblage is imaged through the donor ejection layer, the ejection layer should be capable of transmitting the laser radiation, and not be adversely affected by this radiation.

Examples of suitable polymers include (a) polycarbonates having low decomposition temperatures ($T_d$), such as polypropylene carbonate; (b) substituted styrene polymers having low decomposition temperatures, such as poly(alpha-methylstyrene); (c) polyacrylate and polymethacrylate esters, such as polymethyhnethacrylate and polybutylmethacrylate; (d) cellulosic materials having low decomposition temperatures ($T_d$), such as cellulose acetate butyrate and nitrocellulose; and (e) other polymers such as polyvinyl chloride; poly(chlorovinyl chloride) polyacetals; polyvinylidene chloride; polyurethanes with low $T_d$; polyesters; polyorthoesters; acrylonitrile and substituted acrylonitrile polymers; maleic acid resins; and copolymers of the above. Mixtures of polymers can also be used. Additional examples of polymers having low decomposition temperatures can be found in Foley et al., U.S. Pat. No. 5,156,938. These include polymers which undergo acid-catalyzed decomposition. For these polymers, it is frequently desirable to include one or more hydrogen donors with the polymer.

Preferred polymers for the ejection layer are polyacrylate and polymeth-acrylate esters, low $T_d$ polycarbonates, nitrocellulose, poly(vinyl chloride) (PVC), and chlorinated poly(vinyl chloride) (CPVC). Most preferred are poly(vinyl chloride) and chlorinated poly(vinyl chloride).

Other materials can be present as additives in the ejection layer as long as they do not interfere with the essential function of the layer. Examples of such additives include coating aids, flow additives, slip agents, antihalation agents, antistatic agents, surfactants, and others which are known to be used in the formulation of coatings.

Preferred embodiments of this invention include those having relatively flexible ejection layers. One or more plasticizers can be added to a given ejection layer polymer composition in order to increase the flexibility of the polymeric composition. The increase in flexibility is indicated by changes in the magnitudes of two key physical parameters—the tensile modulus and the glass transition temperature (GTT). Both of these parameters tend to decrease in magnitude as the amount of plasticizer is increased, which indicates increasing flexibility of the polymeric composition.

A wide variety of different plasticizers can be used in order to increase the flexibility of an ejection layer composition. Suitable plasticizers, include, but are not limited to, the following: phthalic acid derivatives, such as diphenyl phthalate and di-(2-ethylhexyl) phthalate, ricinoleic acid derivatives, such as butyl ricinoleate and propylene glycol ricinoleate, sebacic acid derivatives, such as dibutyl sebacate and dimethyl sebacate, stearic acid derivatives, such as n-butyl stearate and propylene glycol monostearate, succinic acid derivatives, such as diethyl succinate, sulfonic acid derivatives, such as N-ethyl o,p-toluenesulfonamide, phosphoric acid derivatives, such as tricresyl phosphate and tributyl phosphate, paraffin derivatives, such as chloroparaffins containing about 40 to 70% chlorine, palmitic acid derivatives, such as isopropyl palmitate and methyl palmitate, oleic acid derivatives, such as butyl oleate and glycerol trioleate, myristic acid derivatives, such as isopropyl myristate, mellitates, such as tricapryl trimellitate and triisodecyl trimellitate, maleic acid derivatives, such as di-n-butyl maleate and di-(2-ethylhexyl) maleate, linoleic acid derivatives, such as methyl linoleate, lauric acid derivatives, such as methyl laurate, isophthalic acid derivatives, such as diphenyl isophthalate and dimethyl isophthalate, isobutyrate derivatives, such as 2,2,4-trimethyl-1,3-pentanediol, diisobutyrate, glycerol derivatives, such as glycerol triacetate, fumaric acid derivatives, such as dibutyl fumarate, epoxy derivatives, such as n-octyl epoxystearate, citric acid derivatives, such as tri-n-butyl citrate and acetyl triethyl citrate, benzoic acid derivatives, such as diethylene glycol dibenzoate and dipropylene glycol dibenzoate, azelaic acid derivatives, such as diisodecyl azelate and dimethyl azelate, and adipic acid derivatives, such as dicapryl adipate and diisodecyl adipate.

The binder polymer(s) generally makes up 100 percent by weight of the ejection layer unless plasticizer or other excipients are added. The relative weight percentage of plasticizer to binder varies depending upon the flexibility of the polymeric binder. The weight percentage of plasticizer generally ranges from 0–20 percent based upon the total weight of the ejection layer. The amount of plasticizer may be varied beyond this percentage range depending upon the particular polymeric composition and upon the desired tensile modulus and flexibility. Sufficient binder should be present at least in the proximity adjacent to the heating layer to effectively decompose and propel the transfer layer.

The donor ejection layer in this invention typically has a thickness of about 12.5 micrometers (0.5 mil) to about 250 micrometers (10 mils) when it is present as a single or multiple layer without an additional bottom layer (optional). The thickness of the ejection layer(s) in this embodiment is important. If the thickness is less than about 12.5 micrometers (0.5 mil), the ejection layer is not of sufficient strength to be properly handled readily; if the thickness is greater than about 250 micrometers (10 mils), the ejection layer is likely to have significantly reduced flexibility and conformability. A preferred thickness is about 25 micrometers (1 mil) to about 100 micrometers (4 mils). The most preferred thickness is about 50 micrometers (2 mils) to about 75 micrometers (3 mils).

Although it is preferred to have a single ejection layer, it is also possible to have more than one ejection layer or an ejection layer or layers on a flexible bottom layer—e.g.—at least a four-layer system. The different ejection layers in an ejection multilayer system can have the same or different compositions, as long as they all function as described above. The total thickness of all the ejection layers and/or the ejection layer(s) and the bottom layer should be in the range given above, i.e., about 12.5 micrometers (0.5 mil) to about 250 micrometers (10 mils). Several different embodiments of ejection multilayer systems of this invention are described below. The invention is exemplified by these particular embodiments but is not limited to only these embodiments. If a flexible bottom layer is utilized the ejection layer can be less than 1 mil—e.g., an ultrathin layer to 1 mil.

The ejection layer(s) can be coated as a dispersion in a suitable solvent, provided that the resulting ejection layer(s) obtained upon drying are sufficiently transparent such that little or no scattering of laser light occurs. However, in most cases, it is preferred to coat the layer(s) from a solution to insure that a transparent ejection layer(s) results. Any suitable solvent can be used as a coating solvent, as long as it does not deleteriously affect the properties of the assemblage, using conventional coating techniques or printing techniques, such as those used in, for example, gravure printing.

A thermal amplification additive is optionally present in the ejection layer(s) or the top layer. It can also be present in both of these layers.

The function of the additive is to amplify the effect of the heat generated in the heating layer and thus to further increase sensitivity. The additive should be stable at room temperature. The additive can be (1) a compound which, when heated, decomposes to form gaseous byproducts, (2) a dye which absorbs the incident laser radiation, or (3) a compound which undergoes a thermally induced unimolecular rearrangement which is exothermic. Combinations of these types of additives may also be used.

Thermal amplification additives which decompose upon heating include those which decompose to form nitrogen, such as diazo alkyls, diazonium salts, and azido ($-N_3$) compounds; ammonium salts; oxides which decompose to form oxygen; carbonates; peroxides. Mixtures of additives can also be used. Preferred thermal amplification additives of this type are diazo compounds such as 4-diazoN,N' diethyl-aniline fluoroborate (DAFB).

When absorbing dye is incorporated in the ejection layer, its function is to absorb the incident radiation and convert this into heat, leading to more efficient heating. It is preferred that the dye absorb in the infrared region. For imaging applications, it is also preferred that the dye have very low absorption in the visible region. Examples of suitable infrared absorbing dyes which can be used alone or in combination include poly(substituted) phthalocyanine compounds and metal-containing phthalocyanine compounds; cyanine dyes; squarylium dyes; chalcogenopyryioacrylidene dyes; croconium dyes; metal thiolate dyes; bis(chalcogenopyrylo) polymethine dyes; oxyindolizine dyes; bis(aminoaryl) polymethine dyes; merocyanine dyes; and quinoid dyes.

Infrared absorbing materials disclosed in U.S. Pat. Nos. 4,778,128; 4,942,141; 4,948,778; 4,950,639; 5,019,549; 4,948,776; 4,948,777 and 4,952,552 may also be suitable herein. The weight percentage of the thermal amplification additive, versus, for example, the total solid weight composition of the ejection layer may range from 0–20%. When present in the transfer coating, the thermal amplification weight percentage is generally at a level of 0.95–11.5%. The percentage can range up to 25% of the total weight percentage in the transfer coating. These percentages are non-limiting and one of ordinary skill in the art can vary them depending upon the particular composition of the ejection layer or transfer layer.

6. Top Layer

The top layer comprises (i) a polymeric binder which is different from the polymer in the ablatable portion(s) of the ejection layer, and (ii) an imageable component. In a preferred embodiment for photomask fabrication, the imageable component is black.

The binder should be film forming and coatable from solution or from a dispersion. Binders having melting points less than about 250° C. or plasticized to such an extent that the glass transition temperature is <70° C. are preferred. However, heat-fusible binders, such as waxes should be avoided as the sole binder since such binders may not be as durable, although they are useful as cobinders in decreasing the melting point of the top layer.

It is preferred that the binder (polymer) does not self-oxidize, decompose or degrade at the temperature achieved during the laser exposure so that the imageable component and binder are transferred intact for improved durability. Examples of suitable binders include copolymers of styrene and (meth)acrylate esters, such as styrene/methylmethacrylate; copolymers of styrene and olefin monomers, such as styrene/ethylene/butylene; copolymers of styrene and acrylonitrile; fluoropolymers; copolymers of (meth) acrylate esters with ethylene and carbon monoxide; polycarbonates having higher decomposition temperatures; (meth)acrylate homopolymers and copolymers; polysulfones; polyurethanes; polyesters. The monomers for the above polymers can be substituted or unsubstituted. Mixtures of polymers can also be used.

The binder (polymer) generally has a concentration of about 15–50% by weight, based on the total weight of the top layer, preferably 30–40% by weight.

For imaging applications, the imageable component will be a colorant. The colorant can be a pigment or a non-sublimable dye. It is preferred to use a pigment as the colorant for stability and for color density, and also for the high decomposition temperature. For photomask applications, use of a black imageable component is preferred. Examples of preferred inorganic pigments include carbon black and graphite. Examples of suitable organic pigments include Rubine F6B (C.I. No. Pigment 184); Cromophthal® Yellow 3G (C.I. No. Pigment Yellow 93); Hostaperm® Yellow 3G (C.I. No. Pigment Yellow 154); Monastral® Violet R (C.I. No. Pigment Violet 19); 2,9-dimethylquinacridone (C.I. No. Pigment Red 122); Indofast® Brilliant Scarlet R6300 (C.I. No. Pigment Red 123); Quindo Magenta RV 6803; Monastral® Blue G (C.I. No. Pigment Blue 15); Monastral® Blue BT 383D (C.I. No. Pigment Blue 15); Monastral® Blue G BT 284D (C.I. No. Pigment Blue 15); and Monastral® Green GT 751D (C.I. No. Pigment Green 7). Combinations of pigments and/or dyes can also be used.

In accordance with principles well known to those skilled in the art, the concentration of colorant will be chosen to achieve the optical density desired in the final image. The amount of colorant will depend on the thickness of the active coating and the absorption of the colorant. Optical densities greater than 1.3 at the wavelength of maximum absorption are typically required. Preferred optical densities in this invention are those greater than about 2, and more preferred, greater than about 3.

A dispersant is usually present when a pigment is to be transferred, in order to achieve maximum color strength, transparency and gloss. The dispersant is generally an organic polymeric compound and is used to separate the fine pigment particles and avoid flocculation and agglomeration. A wide range of dispersants is commercially available. A dispersant will be selected according to the characteristics of the pigment surface and other components in the composition as practiced by those skilled in the art. However, one class of dispersant suitable for practicing the invention is that of the AB dispersants. The A segment of the dispersant adsorbs onto the surface of the pigment. The B segment extends into the solvent into which the pigment is dispersed. The B segment provides a barrier between pigment particles to counteract the attractive forces of the particles, and thus to prevent agglomeration. The B segment should have good compatibility with the solvent used. The AB dispersants of choice are generally described in "Use of AB Block Polymers as Dispersants for Non-aqueous Coating Systems", by H. C. Jakubauskas, Journal of Coating Technology, Vol. 58, No. 736, pages 71–82. Suitable AB dispersants are also disclosed in U. K. Patent 1,339,930 and U.S. Pat. Nos. 3,684,771; 3,788,996; 4,070,388; 4,912,019; and 4,032,698. Conventional pigment dispersing techniques, such as ball milling, sand milling, etc., can be employed.

For photomask applications, preferably a black dye and/or pigment such as carbon black or other dark material is present in the top layer as the imageable component. The imageable component(s) for photomask applications are chosen such that optical densities on the receiver element in areas where material has been transferred are preferably at least 2.0 and more preferably are about 3.0 or higher.

In general, for this invention, the imageable component is present in an amount of from about 25 to 95% by weight, based on the total weight of the top coating. For color proofing and photomask fabrication applications, the amount of imageable component is preferably 35–65% by weight; for lithographic printing applications, preferably 65–85% by weight.

Other materials can be present as additives in the top layer as long as they do not interfere with the essential function of the layer. Examples of such additives include coating aids, plasticizers, flow additives, slip agents, antihalation agents, antistatic agents, surfactants, and others which are known to be used in the formulation of coatings. However, it is preferred to minimize the amount of additional materials in this layer, as they may deleteriously affect the final product after transfer in thermal imaging. Additives may add unwanted color for color proofing applications, or they may decrease durability and print life in lithographic printing applications.

The top layer generally has a thickness in the range of about 0.1 to 5 micrometers, preferably in the range of about 0.1 to 1.5 micrometers. Thicknesses greater than about 5 micrometers are generally not preferred as they require excessive energy in order to be effectively transferred to the receiver.

Although it is preferred to have a single top layer, it is also possible to have more than one top layer, and the different layers can have the same or different compositions, as long as they all function as described above. The total thickness of the combined top layers should be in the range given above.

The top layer(s) can be coated onto the ejection layer of the donor or on a temporary support as a dispersion in a suitable solvent, however, it is preferred to coat the layer(s) from a solution. Any suitable solvent can be used as a coating solvent, as long as it does not deleteriously affect the properties of the assemblage, using conventional coating techniques or printing techniques, for example, gravure printing.

The donor element can have additional layers as well. For example, an antihalation layer can be used on the side of the flexible ejection layer opposite the top layer. Materials which can be used as antihalation agents are well known in the art. Other anchoring or subbing layers can be present on either side of the flexible ejection layer and are also well known in the art.

In this invention, a pigment, such as carbon black, can be present in a single layer, termed the top layer. This type of pigment functions as both a heat absorber and a colorant, and thus the top layer can have a dual function of being both a heating layer and a colorant-bearing layer. A preferred colorant/heat absorber is carbon black.

B. Receiver Element

The receiver element is the second part of the laserable assemblage, to which the imageable component and non-degraded polymer (polymeric binder) are transferred in the course of thermal imaging. In most cases, the imageable component will not be removed from the donor element in the absence of a receiver element. That is, exposure of the donor element alone to laser radiation does not cause material to be removed, or transferred into air. The material, i.e., the imageable component and binder, is removed from the donor element only when it is exposed to laser radiation and the donor element is in contact with the receiver element, i.e., the donor element actually touches the receiver element.

The receiver element may comprise a receiver support and, optionally, an image-receiving layer. The receiver support comprises a dimensionally stable sheet material. The assemblage can be imaged through the receiver support if that support is transparent. Examples of transparent films include, for example polyethylene terephthalate, polyether sulfone, a polyimide, a poly(vinyl alcohol-co-acetal), or a cellulose ester, such as cellulose acetate. Examples of opaque support materials include, for example, polyethylene terephthalate filled with a white pigment such as titanium dioxide, ivory paper, or synthetic paper, such as Tyvek® spunbonded polyolefin. Paper supports are typical and are preferred for most applications of this invention. For lithographic printing applications, the support is typically a thin sheet of aluminum (such as anodized aluminum) or a polyester. Roughened supports may also be used in the receiver element.

Although the imageable component can be transferred directly to the receiver support, the receiver element typically has an additional image-receiving layer on one surface thereof. For image formation applications, the image-receiving layer can be a coating of, for example, a polycarbonate, a polyurethane, a polyester, polyvinyl chloride, styrene/acrylonitrile copolymer, poly (caprolactone), and mixtures thereof. This image-receiving layer can be present in any amount effective for the intended purpose. In general, good results have been obtained at coating weights of 1 to 5 g/m$^2$. For lithographic applications, typically the aluminum sheet is treated to form a layer of anodized aluminum on the surface as a receptor layer. Such treatments are well known in the lithographic art.

The receiver element does not have to be the final intended support for the imageable component. In other words, the receiver element can be an intermediate element and the laser imaging step can be followed by one or more transfer steps by which the imageable component is transferred to the final support. This is most likely the case for multicolor proofing applications in which the multicolor image is built up on the receiver element and then transferred to the permanent paper support.

PROCESS STEPS

1. Exposure

The first step in the process of the invention is imagewise exposing the laserable assemblage to laser radiation. The laserable assemblage comprises the (photosensitive) donor element and the receiver element, described above. The donor element (160) and the receiver element (195) can optionally be laminated together to form the laserable assemblage, or they can optionally be bonded peripherally to form the laserable assemblage.

The assemblage is prepared following removal of coversheet(s), if present, by placing the donor element in contact with the receiver element such that the top layer coating actually touches the receiver element or the image-receiving layer on the receiver element. In some instances the coversheet of the receiver element is not removed in which case the top layer touches the coversheet of the receiver element. Vacuum and/or pressure can be used to hold the two elements together. Alternatively, the donor and receiver elements can be taped together and taped to the imaging apparatus, or bonded together at peripheral edges prior to imaging, or a pin/clamping system can be used. As yet another alternative, the donor element can be laminated to the receiver element to afford a laserable assemblage. The laserable assemblage can be conveniently mounted on a drum to facilitate laser imaging.

Various types of lasers can be used to expose the laserable assemblage. The laser is preferably one emitting in the infrared, near-infrared or visible region. Particularly advantageous are diode lasers emitting in the region of 750 to 870 nm which offer a substantial advantage in terms of their small size, low cost, stability, reliability, ruggedness and ease of modulation. Diode lasers emitting in the range of 780 to 850 nm are most preferred. Such lasers are available from, for example, Spectra Diode Laboratories (San Jose, Calif.).

In general, the exposure can take place through the donor element or through the receiver element, provided that these are substantially transparent to the laser radiation. Surprisingly, it was discovered that laser imaging in this invention can effectively be done with high resolution through the photosensitive donor element, even though the imaging infrared actinic radiation must pass through the photohardenable layer to reach the top layer. One skilled in the art might have expected considerable loss of resolution due to light scattering upon passage of actinic radiation through the photohardenable layer, since it is a multiphase composition which contains numerous components that can have differing refractive index values.

Excellent imaging results were nevertheless obtained upon imaging in this manner through the photosensitive donor element as the examples illustrate. More specifically, the examples (set forth infra) illustrate that undesired pixel areas of the pigmented top layer material upon thermal imaging with a laser are clearly transferred with high resolution from the photosensitive donor element to the receiver element, resulting in clear pixel areas on the photomask that is fabricated that are characterized in having high clarity, such that these clear pixel areas are very efficient in transmitting actinic radiation. Furthermore, desired pixel areas of pigmented top layer material are retained on the photosensitive donor element during the course of laser thermal imaging. These desired pixel areas have high optical density values and are efficient in blocking actinic radiation. The net result is that a high resolution photomask is fabricated from the photosensitive donor element upon thermal imaging.

In this invention, imaging through the photosensitive donor element (i.e., wherein light first passes through the donor element support) is preferred, especially since an opaque paper can then be employed as the receiver element.

As an alternative, however, imaging can be effected through the receiver element, if the receiver element is substantially transparent to infrared radiation. Imaging in this case is carried out by imagewise exposure of the laserable assemblage through the receiver element to infrared laser radiation.

The laserable assemblage is exposed imagewise so that material, i.e. the binder and the imageable component, is transferred to the receiver element in a pattern. The pattern itself can be, for example, in the form of dots or line work generated by a computer, in a form obtained by scanning artwork to be copied, in the form of a digitized image taken from original artwork, or a combination of any of these forms which can be electronically combined on a computer prior to laser exposure. The laser beam and the laserable assemblage are in constant motion with respect to each other, such that each minute area of the assemblage, i.e., "pixel" is individually addressed by the laser. This is generally accomplished by mounting the laserable assemblage on a rotatable drum. A flat bed recorder can also be used.

For photosensitive donor elements of this invention that are used to make photomasks on the photosensitive elements for subsequent use in making relief images, the material transferred from each donor to each receiver and which becomes a mask area, or, alternatively, in other embodiments the material remaining on the receiver as a mask area must be "substantially opaque to actinic radiation". The term "substantially opaque to actinic radiation" means that the amount of actinic radiation transmitted to the underlying photosensitive layer or photohardenable layer is so miniscule that no significant amount of photoinduced reaction occurs in the photosensitive or photohardenable layer.

2. Separation

The next step in the process of the invention is separating the donor element from the receiver element. Usually this is done by simply peeling the two elements apart. This generally requires very little peel force, and is accomplished by simply separating the donor support from the receiver element. This can be done using any conventional separation technique and can be manual or automatic without operator intervention.

3. Additional Processing for Photomask Embodiments

For the embodiments of this invention that involve fabrication of a photomask on a photosensitive element and subsequent use of the photomask to create a relief image, there are additional processing steps, which are discussed below. These additional processing steps will normally include, but are not limited to, imagewise exposure of the photosensitive element to create areas that are photohardened and with other areas still present that remain unphotohardened (areas that remain photohardenable). A subsequent development step to remove unphotohardened material is done under conditions where the areas that are photohardened remain during the course of development, thus creating a relief image on what was the photosensitive element with use of the photomask. Additional details are presented below.

The imagewise exposure is often achieved, but is not limited to, overall exposing the photosensitive element with actinic radiation through the photomask after fabrication of the photomask on the photosensitive element. The type of radiation used is dependent on the type of photoinitiator in the photohardenable layer, and can include, but is not limited to, ultraviolet (UV), visible, and near-infrared radiation. The actinic radiation-opaque material in the photomask on the photohardenable layer prevents the material beneath from being exposed to the actinic laser radiation. For photohardenable systems, those areas covered by the actinic radiation-opaque mask do not polymerize or crosslink. The areas not covered by the actinic radiation-opaque mask are exposed to actinic radiation and photoharden. Most photoinitiators are sensitive to visible or UV radiation. Examples of suitable visible or UV sources include carbon arcs, mercury-vapor arcs, fluorescent lamps, electron flash units electron beam units and photographic flood lamps. The most suitable sources of UV radiation are the mercury-vapor lamps, particularly the sun lamps. A standard radiation source is the Sylvania 350 Blacklight fluorescent lamp (FR 48T12/350VL/VHO/180, 115 w) which has a central wavelength of emission around 354 nm.

It is contemplated that both the imagewise exposure of a laserable assemblage to actinic radiation during thermal imaging to create a photomask on a photosensitive element and the subsequent overall exposure to actinic radiation (to create areas that are photohardened while other areas remain unphotohardened) can be carried out in the same equipment. It is preferred that this be done using a drum—i.e., the photosensitive element is mounted on a drum which is rotated to allow for exposure of different areas of the element.

For photohardenable systems, it is preferred that this exposure step be carried out in the absence of oxygen. The photohardening reactions will take place when oxygen is present, but they require longer exposure times and the results are less reproducible. The element can be placed in a vacuum frame for the exposure step. If the surface of the photohardenable layer is tacky some type of releasable covering should be put over the layer to prevent it from sticking to the cover in the vacuum frame. Exposure can also be carried out in an inert atmosphere, e.g., nitrogen, or with the surface being swept with an inert atmosphere.

If a barrier layer is present, it will effectively prevent the interaction of oxygen with the photohardenable layer and, thus, the exposure step can be carried out in the presence of atmospheric oxygen.

The actinic radiation exposure time can vary from a few seconds to minutes, depending upon the intensity and spectral energy distribution of the radiation, its distance from the photosensitive element, and the nature and amount of the photosensitive composition (e.g., photohardenable composition). Typically for the photosensitive elements of this invention, a mercury vapor arc or a sunlamp is used at a distance of about 1.5 to about 60 inches (3.8 to 153 cm) from the element. Exposure temperatures are preferably ambient or slightly higher, i.e., about 20° C. to about 35° C.

Following overall exposure to actinic radiation through the photomask formed by the actinic radiation-opaque material, the image is developed to form a relief. The development step is based on the differences in physical properties between the areas of the photohardenable layer which have been exposed to actinic radiation, and those areas which have not been exposed. Development may involve, e.g., washing out the more soluble portions of the photohardenable layer, or transfer of areas of the photohardenable layer to another substrate. When systems are used in which exposure to actinic radiation results in differences in solubility, development is accomplished by washing with a suitable developer solvent. Development is usually carried out at about room temperature. The developers can be organic solvents, aqueous or semi-aqueous solutions. The choice of the developer will depend on the chemical nature of the photosensitive material (e.g., material in the photohardenable layer of the photosensitive element) to be removed.

The following terms are used throughout the specification and/or examples and have the meaning set forth below.

DEFINITIONS

DSC—Differential scanning calorimetry, which is a well-known thermal analysis technique useful for determination of $T_g$ values and other characteristic temperatures.

$T_d$—Thermal decomposition temperature for a given polymer measured in °C. This value is usually determined using a thermal analysis method such thermal gravimetric analysis or differential scanning calorimetry (DSC).

GTT—Glass transition temperature for a given polymer. The GTT or $T_g$ of a polymer is a type of second order transition. It is defined to be the characteristic temperature for a polymer being heated that represents a phase change from a glassy state (below $T_g$) to a rubbery, flexible state (above $T_g$). Generally, if a polymer has a highly flexible chain, it will have a low $T_g$, whereas, if a polymer is rigid, it will have a high $T_g$. For a given polymer at a temperature below its $T_g$, the polymer will be hard and glassy; for the polymer at a temperature above its $T_g$, it is soft and flexible. The $T_g$ of a given polymer is often determined by DSC.

$T_g^0$—This is the glass transition temperature for a given polymer measured by DSC on a sample of the polymer that is either pure polymer containing no plasticizer or is at most only lightly plasticized polymer, such that the measured glass transition temperature is within ±3° C. of that for the unplasticized polymer. This temperature is a characteristic temperature for a given polymer. This temperature is in °C. unless indicated otherwise.

$T_g^1$—This is the glass transition temperature for a given polymer measured by DSC on a sample of the polymer that contains one or more known plasticizers, such that the measured glass transition temperature of the sample is now $T_g^1$ instead of $T_g^0$, wherein $|T_g^0-T_g^1|>3°$ C. This temperature ($T_g^1$) is a characteristic temperature for a given polymer that is plasticized with a given plasticizer (s) to a given extent (degree of plasticization, percentage of plasticizer present, etc.).

Modulus (Mod.)—This is the tensile modulus or simply modulus of the sample measured on an Instron® unit.

Stress-Strain Curves—These curves are determined by measuring continuously the force developed on a sample when elongated at constant rate of extension. The stress-strain curve serves to define several quantities including modulus, yield stress and elongation at break. Modulus in the slope of the curve.

Sensitivity (Sens.)—This is the sensitivity, or ablation threshold, of the transfer element, (Sens.) and it corresponds to the minimum laser fluence required for transfer or material removal to occur. The fluence is the laser energy per unit area (e.g. millijoules per $cm^2$).

The following binders are readily utilized in the present invention.

EJECTION LAYER BINDERS

PVC poly(vinyl chloride)

(Aldrich) $T_{d1}=282°$ C., $T_{d2}=465°$ C.

TOP LAYER BINDERS

PEO Polyethylene oxide, $M_w$=100,000
(E. I. du Pont de Nemours and Company, Wilmington, Del.)

OTHER MATERIALS

CyHex Cyclohexanone (Aldrich)
MC Methylene chloride (Aldrich)
MEK Methyl ethyl ketone (Aldrich)
PET Polyethylene terephthalate
(DuPont Mylar® 200D)

The following non-limiting examples demonstrate the processes, donor elements and laserable assemblages claimed and described herein. All temperatures throughout the specification are in °C. (degrees Centigrade) and all percentages are weight percentages unless indicated otherwise.

EXAMPLES

These examples involve using the laserable assemblages of this invention to create photomasks on photopolymer elements, such as flexographic printing plates and photoresists. The general procedures given below were followed in each of the examples. More specifics on each example or set of examples are given below the heading for the example or set of examples.

In the examples, an image on a receiver, usually a paper, was obtained in making a photomask such that undesired pigmented material is transferred imagewise upon laser imaging to the receiver element from the (photosensitive) donor element to afford areas on the donor element that are transparent to actinic radiation. Upon completion of this laser imaging for photomask fabrication, the donor element has fabricated on it a photomask having areas where pigmented material has been removed (i.e., transferred to the paper) that are transparent to actinic radiation and other areas that are pigmented that are not transparent to actinic radiation. The images on paper were obtained using a CREO exposure engine (Creo Inc., Vancouver, Canada). The system comprises an external drum 30 inches (76 cm) long and 12 inches (30 cm) in diameter. The laserable assemblage, comprising the donor element and the paper (receiver element) was written with an array of 32 infrared diode lasers writing at 830 nm at 1 microsecond pulse width. Beam size was adjusted to 5.8 microns, and the drum speed varied at 25 RPM increments from 100 to 300 RPM to measure sensitivity.

In these examples, a paper (as the receiver element) was vacuum held on the drum surface, and a black pigment-coated (photopolymer and/or photohardenable) photosensitive element (e.g., flexographic printing plate or a photoresist) was placed on top of the paper, such that the black pigment-coated layer was in direct contact with the paper. This black pigment-coated photosensitive element is the donor element, and it is exposed from the backside (i.e., actinic radiation first passes through the support (120) as illustrated in FIG. 1). The photosensitive element was cut wider and longer than the paper receiver underneath.

EXAMPLE 1

The following example illustrates application of the invention to produce a black mask which is digitally written onto Cyrel® 67 HOS flexographic printing plate (E. I. du Pont de Nemours and Company, Wilmington, Del.) using the CREO® write engine described supra. A Cyrel® 67 HOS plate consists of a support, a photopolymer layer and a polyamide release barrier layer after removal of a coversheet. A 2-layer thermal film was coated onto the release layer of the flexographic printing plate in two coating steps of two different layers. First, a 1 micron flexible ejection layer was coated from a 10% by weight PVC solution directly onto the commercial 67 HOS Cyrel® flexographic printing plate. The solids in the PVC solution were adjusted to a viscosity of 300–400 centipoise. Diphenyl phthalate was the plasticizer in this PVC formulation. The formulation of the (flexible) ejection layer was as follows:

7.5 grs poly vinyl chloride (Aldrich)
2.5 grs diphenyl phthalate (Aldrich)
90 grs methyl ethyl ketone (Aldrich)

The solution was stirred at room temperature for 8 hours prior to coating. The film was coated by hand using a wire rod (#4) to a 1 micron thickness, which was measured using a profilometer (Dektak IIA). The glass transition temperature of this PVC flexible ejection layer was ~60° C. After the drying of the ejection layer, a water soluble black mask layer (top layer) was coated directly on top of the flexible ejection layer using a wire rod (#4) to a thickness of about 1 micron. The formulation of this layer is listed below:

A black dispersion was used containing carbon black/binder. The binder was polyethylene oxide (molecular weight=100,000 ($M_w$–weight average molecular weight)) neutralized in ammonium hydroxide to make it water soluble.

| | |
|---|---:|
| pigment/binder dispersion 15% in $H_2O$ | 50 grs |
| Ammonium Hydroxide | 0.833 grs |
| $H_2O$ | 8.054 grs |

The ratio of pigment to binder in this example was 2:1.

Thermal films with two different top layers were made and tested. The two top layers were designated top layer 1 and top layer 2. The respective compositions of coatings for these two top layers are given below.

| | |
|---|---:|
| Top Coating 1 | |
| Black Dispersion (15% solids) | 18 grs |
| where Black Dispersion is Calvin Black (Degussa Co., Germany) | |
| 15% Polyethylene Oxide in water | 2 grs |
| Top Coating 2 | |
| Black Dispersion (15% solids) | 16 grs |
| where Black Dispersion is: Calvin Black | |
| 15% Polyethylene Oxide in water | 4 grs |

The resulting flexographic printing plate coated with the 2-layer thermal film, which is the donor element in this example, was exposed in the CREO® laser unit with the following arrangement. A piece of receiving paper (receiver element) was placed on the drum and the black coated side of the coated flexographic printing plate was placed directly in contact with the receiving paper. Good contact between the black-coated layer of the coated printing plate and the paper receiver was maintained by holding the structure with applied vacuum. The laser diode head was focused onto the black pigmented layer and the flexographic printing plate was exposed from the back (i.e., incident laser light first passes through the support layer of the flexographic printing plate). That is, the lasers were incident from the back side of the flexographic printing plate, focused onto the ejection layer/black layer interface. The light absorption at this interface led to a local temperature rise and partial decomposition of the (PVC) ejection layer. Gaseous products trapped with high kinetic energy led to the transfer of the black layer onto the paper receiver. A % dot range pattern was digitally written onto the mask by transferring the exposed material onto the receiver at 125 RPM. The focus was maintained at 8 microns. The exposed mask with a solid optical density of 3.05 (with top layer 1) and 2.66 (with top layer 2) held 2 to 99.28% dots in 150 lines per inch screen. From these results, it was concluded that there was obtained a high resolution photomask on the flexographic printing plate.

EXAMPLE 2

The following additional example also illustrates application of the invention to produce a black mask which is digitally written onto Cyrel® 67 HOS flexographic printing plate (E. I. du Pont de Nemours and Company, Wilmington, Del.) using the CREO® write engine described supra. A Cyrel® 67 HOS plate consists of a support, a photopolymer layer, and a polyamide release layer after removal of a coversheet. A 2-layer thermal film was coated onto the release layer of the flexographic printing plate in two coating steps of two different layers to produce the photosensitive donor element. First, a 1 micron (flexible) ejection layer was coated from a 10% by weight PVC solution directly onto the commercial 67 HOS Cyrel® flexographic printing plate. The solids in the PVC solution were adjusted to a viscosity of 300–400 centipoise. Diphenyl phthalate was the plasticizer in this PVC formulation. The formulation of the flexible ejection layer was as follows:

| | | |
|---|---|---|
| 7.5 grs | poly vinyl chloride (Aldrich) | |
| 2.5 grs | diphenyl phthalate (Aldrich) | |
| 90 grs | methyl ethyl ketone (Aldrich) | |

The solution was stirred at room temperature for 8 hours prior to coating. The film was coated by hand using a wire rod (#4) to a 1 micron thickness, which was measured using a profilometer (Dektak IIA). The glass transition temperature of this PVC flexible ejection layer was ~60° C. After the drying of the ejection layer, a water soluble black mask layer (top layer) was coated directly on top of the flexible ejection layer using a wire rod (#4) to a thickness of about 1 micron. The formulation of this layer is listed below:

The black dispersion used contains a carbon black/binder. The binder was an A//B type block copolymer of a composition having n-butylmethacrylate (10)/methylmethacrylate (5)//methacrylic acid (10) as comonomers for the A and B blocks, respectively. It was neutralized with ammonium hydroxide. It had been prepared by group transfer polymerization (see U.S. Pat. No. 4,417,034). The top layer composition was:

| | |
|---|---|
| pigment/binder dispersion 15% in H$_2$O | 50 grs |
| Ammonium Hydroxide | 0.833 grs |
| H$_2$O | 8.054 grs |

The ratio of pigment to binder in this example was 2:1.

The pigment in this example was carbon black from Cabot Corp.

The resulting flexographic printing plate coated with the 2-layer thermal film, which is the photosensitive donor element in this example, was exposed in the CREO® laser unit with the following arrangement. A piece of receiving paper (receiver element) was placed on the drum and the black coated side of the coated flexographic printing plate was placed directly in contact with the receiving paper. Good contact between the black-coated layer of the coated printing plate and the paper receiver was maintained by holding the structure with applied vacuum. The laser diode head was focused onto the black pigmented layer and the flexographic printing plate was exposed from the back (i.e., incident laser light first passes through the support layer of the flexographic printing plate). That is, the lasers were incident from the back side of the flexographic printing plate, focused onto the flexible ejection layer/black layer interface. The light absorption at this interface led to a local temperature rise and partial decomposition of the (PVC) flexible ejection layer. Gaseous products trapped with high kinetic energy led to the transfer of the black layer onto the paper receiver. A % dot range pattern was digitally written onto the mask by transferring the exposed material onto the receiver at 125 RPM. The focus was maintained at 8 microns. The exposed mask with a solid optical density of 2.97 held 1.5 to 99% dots in 150 lines per inch screen. From these results, it was concluded that there was obtained a high resolution photomask on the flexographic printing plate.

What is claimed is:

1. An assemblage for use in a laser-induced thermal transfer process, the assemblage comprising:
   (A) a photosensitive donor element comprising in order:
      (A1) a support;
      (A2) a photohardenable layer comprising a binder, at least one photohardenable component, and an initiator;
      (A3) optionally a barrier layer;
      (A4) optionally a coversheet;
      (A5) at least one ejection layer comprising a first polymer having a decomposition temperature $T_1$; and
      (A6) at least one top layer having an outer surface and comprising (i) a second polymer having a decomposition temperature $T_2$ and (ii) an imageable component;
   and
   (B) a receiver element comprising in order:
      (B1) a receiver support; and
      (B2) optionally an image-receiving layer;
   wherein the outer surface of the top layer (A6) is adjacent to and in contact with the receiver support (B1) or the image-receiving layer (B2) of the receiver element and wherein a photomask for use in preparing a relief image is fabricated on the photosensitive donor element according to the laser-induced thermal transfer process.

2. The assemblage according to claim 1, wherein the binder of the photohardenable layer of the photosensitive donor element is elastomeric.

3. The assemblage according to claim 1, wherein the binder of the photohardenable layer of the photosensitive donor element contains acid or base functionality at a sufficient level, such that the photohardenable layer, following imagewise exposure to actinic radiation, is aqueous developable using aqueous developer solutions that are either basic or acidic.

4. A laser-induced, thermal transfer process which comprises:
   (1) imagewise exposing to laser radiation a laserable assemblage comprising:
      (A) a photosensitive donor element comprising in order:

(A1) a support;

(A2) a photohardenable layer comprising a binder, at least one photohardenable component, and an initiator;

(A3) optionally a barrier layer;

(A4) optionally a coversheet;

(A5) a least one ejection layer comprising a first polymer having a decomposition temperature $T_1$; and (A6) at least one top layer having an outer surface and comprising (i) a second polymer having a decomposition temperature $T_2$ and (ii) an imageable component;

and (B) a receiver element comprising in order:

(B1) a receiver support; and (B2) optionally an image-receiving layer;

wherein the outer surface of the top layer (A6) is adjacent to and in contact with the receiver support (B1) or the image-receiving layer (B2) of the receiver element; and (2) separating the donor element from the receiver element, thereby forming a photomask on the photosensitive donor element.

5. The process according to claim 4 further comprising:

(3) overall exposing the photosensitive donor element formed in step (2) to actinic radiation through the photomask; and (4) treating the product of step (3) with at least one developer solution to at least remove the photomask and areas of the photohardenable layer (A2) which were not exposed to actinic radiation.

* * * * *